(12) United States Patent
Tao et al.

(10) Patent No.: US 9,728,524 B1
(45) Date of Patent: Aug. 8, 2017

(54) ENHANCED DENSITY ASSEMBLY HAVING MICROELECTRONIC PACKAGES MOUNTED AT SUBSTANTIAL ANGLE TO BOARD

(71) Applicant: Invensas Corporation, San Jose, CA (US)

(72) Inventors: Min Tao, San Jose, CA (US); Zhuowen Sun, Campbell, CA (US); Hoki Kim, Santa Clara, CA (US); Wael Zohni, San Jose, CA (US); Akash Agrawal, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/198,615

(22) Filed: Jun. 30, 2016

(51) Int. Cl.
*H01L 23/49* (2006.01)
*H01L 23/31* (2006.01)
(Continued)

(52) U.S. Cl.
CPC ...... *H01L 25/105* (2013.01); *H01L 23/49805* (2013.01); *H01L 25/0657* (2013.01);
(Continued)

(58) Field of Classification Search
CPC .............. H01L 23/49575; H01L 24/45; H01L 23/3107; H01L 24/97; H01L 21/56; H01L 23/49838; H01L 23/495541
(Continued)

(56) References Cited

U.S. PATENT DOCUMENTS 3,639,888 A 2/1972 Pittman et al.
4,323,914 A 4/1982 Berndlmaier et al.
(Continued)

FOREIGN PATENT DOCUMENTS

CN 2512114 Y 9/2002
CN 1531069 A 9/2004
(Continued)

OTHER PUBLICATIONS

Cheah, Bok Eng, et al., Modeling and Electrical Characteristics Evaluation of Vertical Side-Chip Intemconnection for Compact 3D Integration, School of Electrical and Electronic Engineering, Universiti Sains Malaysia, 13th Electronics Materials and Packaging (EMAP), Nov. 2011.
(Continued)

*Primary Examiner* — John C Ingham
*Assistant Examiner* — Didarul Mazumder
(74) *Attorney, Agent, or Firm* — Lerner, David, Littenberg, Krumholz & Mentlik, LLP

(57) ABSTRACT

A microelectronic assembly includes a plurality of stacked microelectronic packages, each comprising a dielectric element having a major surface, an interconnect region adjacent an interconnect edge surface which extends away from the major surface, and plurality of package contacts at the interconnect region. A microelectronic element has a front surface with chip contacts thereon coupled to the package contacts, the front surface overlying and parallel to the major surface. The microelectronic packages are stacked with planes defined by the dielectric elements substantially parallel to one another, and the package contacts electrically coupled with panel contacts at a mounting surface of a circuit panel via an electrically conductive material, the planes defined by the dielectric elements being oriented at a substantial angle to the mounting surface.

19 Claims, 6 Drawing Sheets

(51) Int. Cl.
  *H01L 21/56* (2006.01)
  *H01L 25/10* (2006.01)
  *H01L 25/065* (2006.01)
  *H01L 23/498* (2006.01)
  *H01L 25/00* (2006.01)
  *H05K 1/18* (2006.01)
  *H05K 1/11* (2006.01)

(52) U.S. Cl.
  CPC .......... *H01L 25/50* (2013.01); *H05K 1/11* (2013.01); *H05K 1/181* (2013.01); *H01L 2225/0651* (2013.01); *H01L 2225/06506* (2013.01); *H01L 2225/06562* (2013.01); *H01L 2225/06582* (2013.01); *H01L 2225/06589* (2013.01); *H05K 2201/10378* (2013.01)

(58) Field of Classification Search
  USPC ....... 257/672, 676, 685, 686, 694, 723, 724, 257/777, 784; 438/110–112, 123, 127
  See application file for complete search history.

(56) References Cited

U.S. PATENT DOCUMENTS

| | | | |
|---|---|---|---|
| 4,336,551 A | 6/1982 | Fujita et al. |
| 4,363,076 A | 12/1982 | McIver |
| 4,500,905 A | 2/1985 | Shibata |
| 4,706,166 A | 11/1987 | Go |
| 4,726,777 A | 2/1988 | Billman et al. |
| 4,784,972 A | 11/1988 | Hatada |
| 4,951,122 A | 8/1990 | Tsubosaki et al. |
| 4,967,262 A | 10/1990 | Farnsworth |
| 5,047,837 A | 9/1991 | Kitano et al. |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,239,447 A | 8/1993 | Cotues et al. |
| 5,304,737 A | 4/1994 | Kim |
| 5,311,401 A | 5/1994 | Gates, Jr. et al. |
| 5,327,327 A | 7/1994 | Frew et al. |
| 5,331,591 A | 7/1994 | Clifton |
| 5,334,872 A | 8/1994 | Ueda et al. |
| 5,347,428 A | 9/1994 | Carson et al. |
| 5,365,106 A | 11/1994 | Watanabe |
| 5,434,745 A | 7/1995 | Shokrgozar et al. |
| 5,466,634 A | 11/1995 | Beilstein, Jr. et al. |
| 5,534,729 A | 7/1996 | Russell |
| 5,538,758 A | 7/1996 | Beach et al. |
| 5,571,754 A | 11/1996 | Bertin et al. |
| 5,592,019 A | 1/1997 | Ueda et al. |
| 5,616,953 A | 4/1997 | King et al. |
| 5,629,566 A | 5/1997 | Doi et al. |
| 5,675,180 A | 10/1997 | Pedersen et al. |
| 5,691,248 A | 11/1997 | Cronin et al. |
| 5,698,895 A | 12/1997 | Pedersen et al. |
| 5,716,759 A | 2/1998 | Badehi |
| 5,721,151 A | 2/1998 | Padmanabhan et al. |
| 5,731,631 A | 3/1998 | Yama et al. |
| 5,737,191 A | 4/1998 | Horiuchi et al. |
| 5,801,448 A | 9/1998 | Ball |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,005,776 A | 12/1999 | Holman et al. |
| 6,030,854 A | 2/2000 | Mashimoto et al. |
| 6,034,438 A | 3/2000 | Petersen |
| 6,071,139 A | 6/2000 | Corisis et al. |
| 6,087,716 A | 7/2000 | Ikeda |
| 6,088,237 A | 7/2000 | Farnworth et al. |
| 6,107,164 A | 8/2000 | Ohuchi |
| 6,175,158 B1 | 1/2001 | Degani et al. |
| 6,225,689 B1 | 5/2001 | Moden et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,320,253 B1 | 11/2001 | Kinsman et al. |
| 6,326,244 B1 | 12/2001 | Brooks et al. |
| 6,326,689 B1 | 12/2001 | Thomas |
| 6,338,980 B1 | 1/2002 | Satoh |
| 6,351,030 B2 | 2/2002 | Havens et al. |
| 6,418,033 B1 | 7/2002 | Rinne |
| 6,472,744 B1 | 10/2002 | Sato et al. |
| 6,472,746 B2 | 10/2002 | Taniguchi et al. |
| 6,476,467 B2 | 11/2002 | Nakamura et al. |
| 6,566,760 B1 | 5/2003 | Kawamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,624,505 B2 | 9/2003 | Badehi |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,710,246 B1 | 3/2004 | Mostafazadeh et al. |
| 6,717,061 B2 | 4/2004 | Yamaguchi et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,777,767 B2 | 8/2004 | Badehi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,853,557 B1 | 2/2005 | Haba et al. |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,125,750 B2 | 10/2006 | Kwan et al. |
| 7,127,807 B2 | 10/2006 | Yamaguchi et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,344,917 B2 | 3/2008 | Gautham |
| 7,355,274 B2 | 4/2008 | Lim |
| 7,405,138 B2 | 7/2008 | Ohuchi et al. |
| 7,408,243 B2 | 8/2008 | Shiffer |
| 7,429,782 B2 | 9/2008 | Brunnbauer et al. |
| 7,452,743 B2 | 11/2008 | Oliver et al. |

(56) References Cited

U.S. PATENT DOCUMENTS

| | | |
|---|---|---|
| 7,514,350 B2 | 4/2009 | Hashimoto |
| 7,521,288 B2 | 4/2009 | Arai et al. |
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,662,671 B2 | 2/2010 | Saeki |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |
| 7,863,159 B2 | 1/2011 | Co et al. |
| 7,888,185 B2 | 2/2011 | Corisis et al. |
| 7,901,989 B2 | 3/2011 | Haba et al. |
| 7,919,846 B2 | 4/2011 | Hembree |
| 7,923,349 B2 | 4/2011 | McElrea et al. |
| 7,951,649 B2 | 5/2011 | Val |
| 7,952,195 B2 | 5/2011 | Haba |
| 8,022,527 B2 | 9/2011 | Haba et al. |
| 8,040,682 B2 | 10/2011 | Shimoda |
| 8,076,788 B2 | 12/2011 | Haba et al. |
| 8,178,978 B2 | 5/2012 | McElrea et al. |
| 8,373,280 B2 | 2/2013 | Harada et al. |
| 8,390,109 B2 | 3/2013 | Popovic et al. |
| 8,431,435 B2 | 4/2013 | Haba et al. |
| 8,551,815 B2 | 10/2013 | Avsian et al. |
| 8,618,659 B2 | 12/2013 | Sato et al. |
| 8,619,659 B2 | 12/2013 | Lee et al. |
| 8,629,543 B2 | 1/2014 | McElrea et al. |
| 8,633,576 B2 | 1/2014 | Zohni et al. |
| 8,674,482 B2 | 3/2014 | Shi et al. |
| 8,704,379 B2 | 4/2014 | Crane et al. |
| 8,723,332 B2 | 5/2014 | McElrea et al. |
| 8,772,920 B2 | 7/2014 | Thacker et al. |
| 9,123,418 B2 | 9/2015 | Lin et al. |
| 9,136,251 B2 | 9/2015 | Cheah et al. |
| 9,490,195 B1 | 11/2016 | Prabhu et al. |
| 9,508,691 B1 | 11/2016 | Delacruz et al. |
| 2001/0012725 A1 | 8/2001 | Maeda et al. |
| 2001/0031548 A1 | 10/2001 | Elenius et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0148597 A1 | 8/2003 | Tan et al. |
| 2003/0162369 A1 | 8/2003 | Kobayashi |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1 | 9/2004 | Nakanishi |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0135067 A1* | 6/2005 | Park .................. H01L 25/0655 361/715 |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0233012 A1 | 10/2006 | Sekiguchi et al. |
| 2006/0252180 A1 | 11/2006 | Moden et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0029866 A1 | 2/2008 | Kim et al. |
| 2008/0083976 A1 | 4/2008 | Haba et al. |
| 2008/0083977 A1 | 4/2008 | Haba et al. |
| 2008/0094086 A1 | 4/2008 | Kim |
| 2008/0112150 A1 | 5/2008 | Jones |
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0045524 A1 | 2/2009 | Mohammed et al. |
| 2009/0065948 A1 | 3/2009 | Wang |
| 2009/0068790 A1 | 3/2009 | Caskey et al. |
| 2009/0102038 A1 | 4/2009 | McElrea et al. |
| 2009/0146137 A1 | 6/2009 | Kim et al. |
| 2009/0160065 A1 | 6/2009 | Haba et al. |

(56) References Cited

U.S. PATENT DOCUMENTS

| | | | |
|---|---|---|---|
| 2009/0209061 A1* | 8/2009 | Jeong | H01L 24/73 438/107 |
| 2009/0230528 A1 | 9/2009 | McElrea et al. | |
| 2009/0316378 A1 | 12/2009 | Haba et al. | |
| 2010/0140753 A1 | 6/2010 | Hembree | |
| 2010/0140811 A1 | 6/2010 | Leal et al. | |
| 2010/0148352 A1 | 6/2010 | Moden | |
| 2010/0207277 A1 | 8/2010 | Bauer et al. | |
| 2010/0327461 A1 | 12/2010 | Co et al. | |
| 2011/0006432 A1 | 1/2011 | Haba et al. | |
| 2011/0031629 A1 | 2/2011 | Haba et al. | |
| 2011/0033979 A1 | 2/2011 | Haba et al. | |
| 2011/0049696 A1 | 3/2011 | Haba et al. | |
| 2011/0187007 A1 | 8/2011 | Haba et al. | |
| 2011/0248410 A1 | 10/2011 | Avsian et al. | |
| 2011/0266684 A1 | 11/2011 | Leal | |
| 2012/0049376 A1 | 3/2012 | Harada et al. | |
| 2012/0051695 A1 | 3/2012 | Harada et al. | |
| 2012/0056327 A1 | 3/2012 | Harada et al. | |
| 2012/0061846 A1 | 3/2012 | Rathburn | |
| 2012/0080807 A1 | 4/2012 | Haba et al. | |
| 2012/0133057 A1 | 5/2012 | Haba et al. | |
| 2012/0211878 A1 | 8/2012 | Popovic et al. | |
| 2012/0313264 A1 | 12/2012 | Sato et al. | |
| 2013/0083583 A1 | 4/2013 | Crisp et al. | |
| 2013/0099392 A1 | 4/2013 | McElrea et al. | |
| 2013/0099393 A1* | 4/2013 | Jeong | H01L 25/0657 257/777 |
| 2013/0119542 A1 | 5/2013 | Oh | |
| 2013/0154117 A1 | 6/2013 | Tan et al. | |
| 2013/0286707 A1 | 10/2013 | Crisp et al. | |
| 2013/0299977 A1 | 11/2013 | Dayringer et al. | |
| 2013/0336039 A1 | 12/2013 | Frans | |
| 2014/0070423 A1 | 3/2014 | Woychik et al. | |
| 2014/0097526 A1 | 4/2014 | Suleiman et al. | |
| 2014/0104786 A1* | 4/2014 | Clayton | H05K 1/147 361/679.54 |
| 2014/0264945 A1 | 9/2014 | Yap et al. | |
| 2015/0098677 A1 | 4/2015 | Thacker et al. | |
| 2015/0200181 A1 | 7/2015 | Haga et al. | |
| 2016/0035698 A1* | 2/2016 | Lee | H01L 25/0657 257/777 |
| 2016/0141232 A1 | 5/2016 | Cannon | |
| 2017/0018485 A1 | 1/2017 | Prabhu et al. | |

FOREIGN PATENT DOCUMENTS

| | | |
|---|---|---|
| CN | 1638118 A | 7/2005 |
| CN | 1905148 A | 1/2007 |
| CN | 104332462 A | 2/2015 |
| DE | 102004039906 A1 | 8/2005 |
| EP | 1041624 A1 | 10/2000 |
| EP | 1763894 A2 | 3/2007 |
| EP | 2650880 A1 | 10/2013 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004047702 A | 2/2004 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |
| WO | 2010057339 A1 | 5/2010 |

OTHER PUBLICATIONS

Kong, J., et al., Sensitivity Study of Channel Termination on Vertical Side-Chip Interconnection, Universiti Sains Malaysia, 35th International Electronic Manufacturing Technology Conference, 2012.

Han, Sang Wook, Wireless Interconnect using Inductive Coupling in 3D-ICs, University of Michigan, 2012.

U.S. Appl. No. 14/883,864 dated Oct. 15, 2015.

* cited by examiner

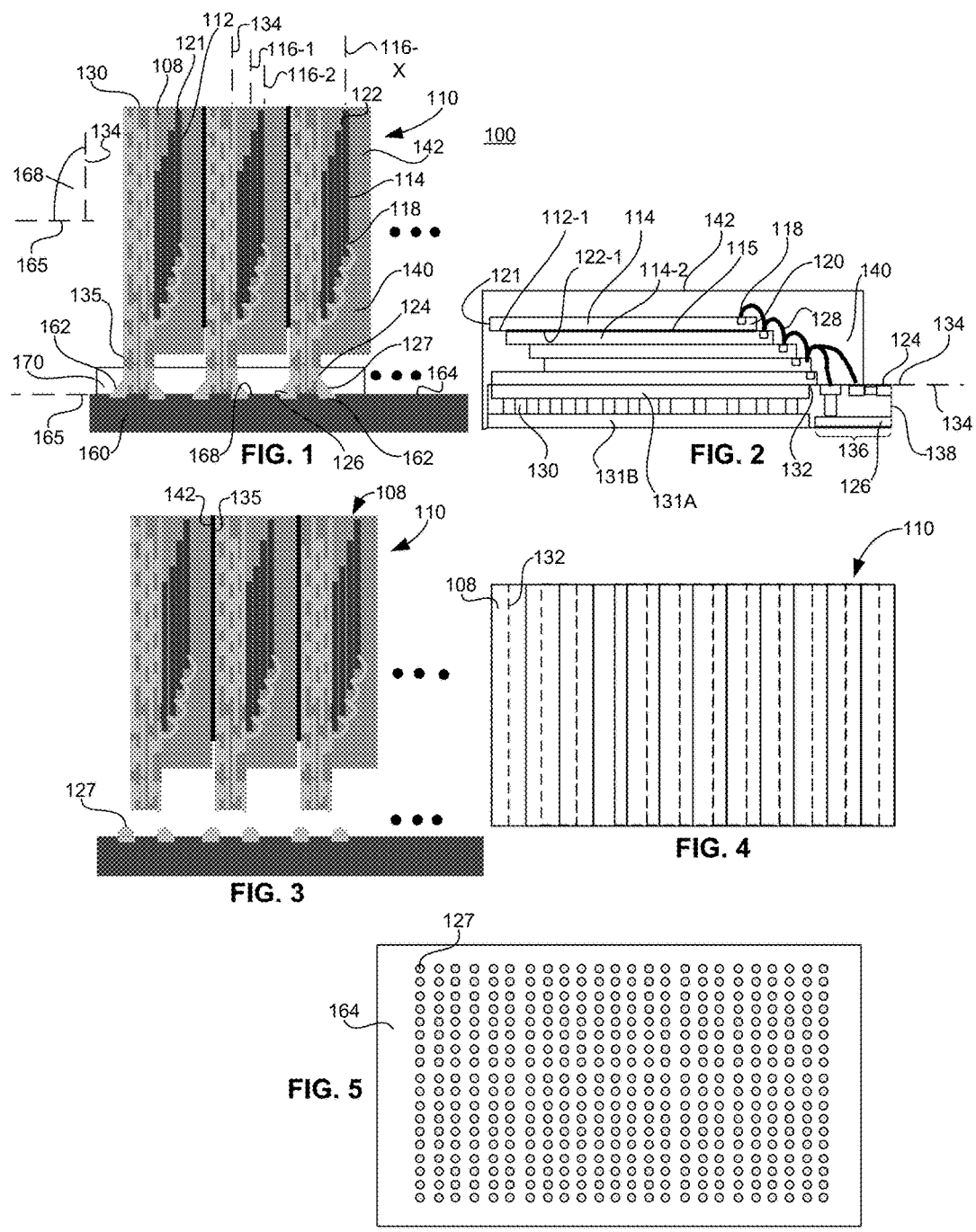

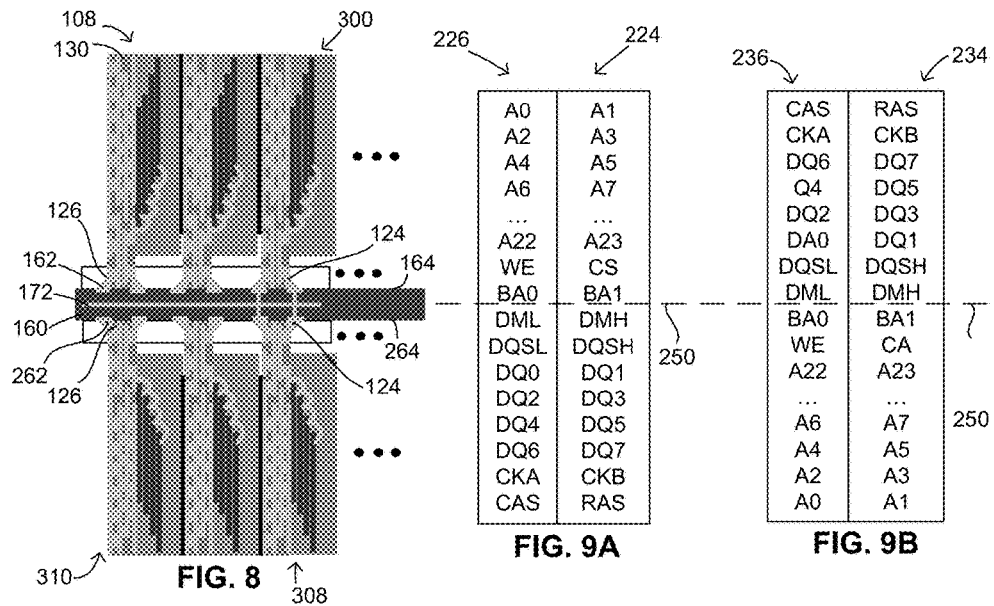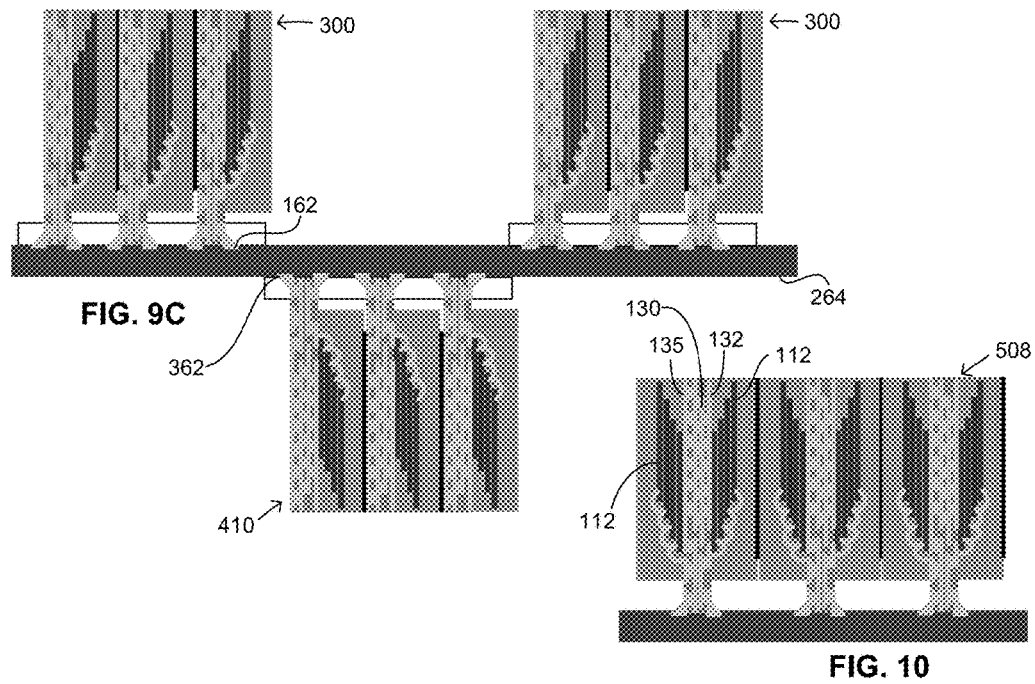

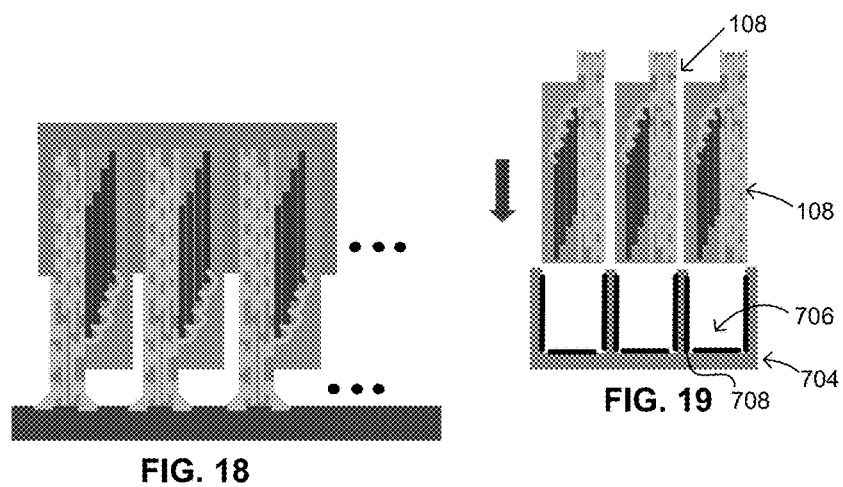
FIG. 18
FIG. 19
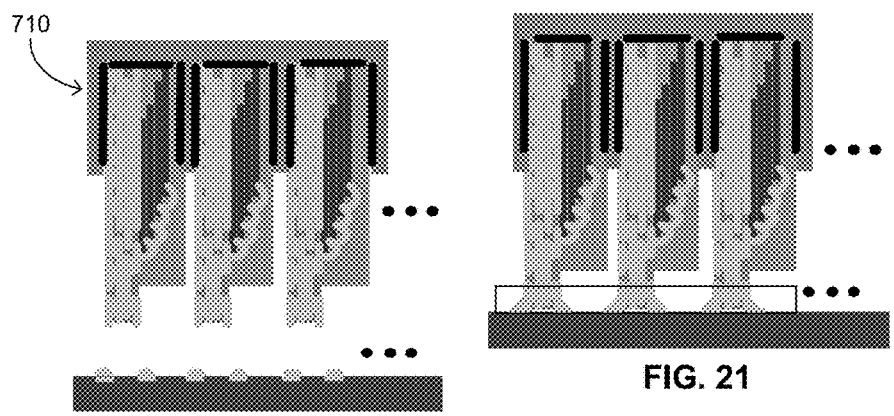
FIG. 20
FIG. 21
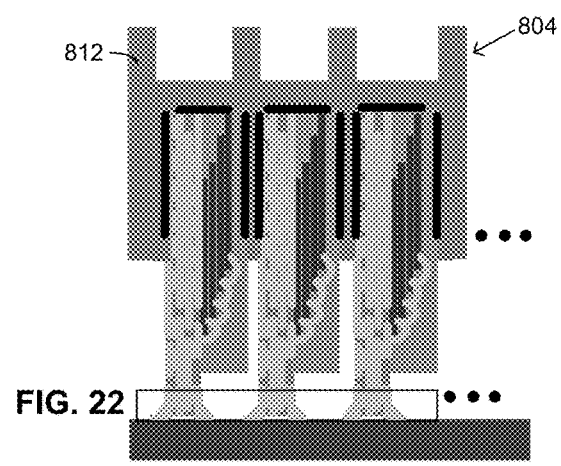
FIG. 22

ENHANCED DENSITY ASSEMBLY HAVING MICROELECTRONIC PACKAGES MOUNTED AT SUBSTANTIAL ANGLE TO BOARD

BACKGROUND OF THE INVENTION

Technical Field

The subject matter of this application relates to microelectronic packages and assemblies in which a plurality of microelectronic packages are stacked with one another and electrically interconnected with a circuit panel.

Description of the Related Art

Semiconductor die or chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer, tablet, smartphone or other mobile device.

In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability.

In spite of the above advances, there remains a need for improved stacked packages and especially stacked chip packages which incorporate multiple chips for certain types of memory, e.g., flash memory. There is a need for such packages and assemblies which are reliable, thin, testable and that are economical to manufacture.

BRIEF DESCRIPTION OF THE SEVERAL VIEWS OF THE DRAWINGS

FIG. 1 is a sectional view depicting a microelectronic assembly in accordance with an embodiment disclosed herein.

FIG. 2 is a sectional view depicting a microelectronic package in accordance with an embodiment disclosed herein.

FIG. 3 is a sectional view depicting a method of assembling a microelectronic package stack with a circuit panel in accordance with an embodiment disclosed herein.

FIG. 4 is a top down view depicting a microelectronic assembly in accordance with an embodiment disclosed herein.

FIG. 5 is a top down view depicting a circuit panel arranged to receive microelectronic packages in accordance with an embodiment disclosed herein.

FIG. 8 is a sectional view depicting a microelectronic assembly in accordance with an embodiment disclosed herein.

FIG. 9A is a diagram illustrating signal assignments of package contacts of a first package to be mounted to a first surface of a circuit panel.

FIG. 9B is a diagram illustrating signal assignments of package contacts of a second package to be mounted to a second surface of a circuit panel opposite the first surface.

FIG. 9C is a sectional view depicting a microelectronic assembly in accordance with a variation of the embodiment disclosed relative to FIG. 1 herein.

FIG. 10 is a sectional view depicting a microelectronic assembly in accordance with a variation of the embodiment disclosed relative to FIG. 1 herein.

FIGS. 18, 19, 20, and 21 are sectional views depicting stages in fabrication of a microelectronic assembly in accordance with an embodiment of the invention.

FIG. 22 is a sectional view depicting a microelectronic assembly in accordance with a variation of the embodiment seen in FIG. 21.

DETAILED DESCRIPTION OF THE INVENTION

Figure 6:
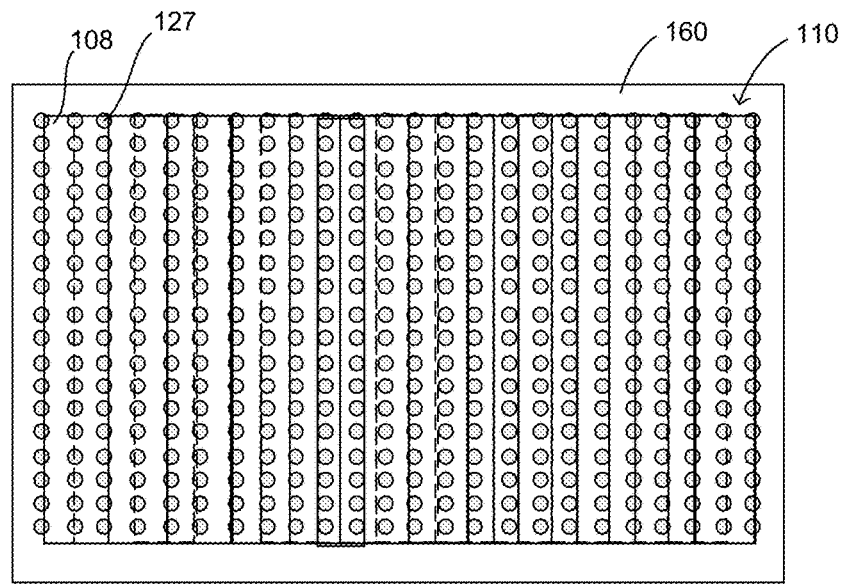
FIG. 6 is a top down view further depicting a microelectronic assembly in accordance with an embodiment disclosed herein.

In accordance with one embodiment, a stacked microelectronic assembly can comprise a plurality of stacked microelectronic packages. Each microelectronic package can include a dielectric element having a major surface defining a plane, an interconnect edge surface extending away from the major surface and an interconnect region adjacent the interconnect edge surface. A plurality of electrically conductive package contacts can be disposed at the interconnect region. A microelectronic element has a front surface overlying and substantially parallel to the major surface, and a plurality of chip contacts at the front surface can be electrically coupled with the package contacts. The plurality of microelectronic packages are stacked with one another such that planes defined by the major surfaces of the dielectric elements are substantially parallel to one another. A circuit panel has a mounting surface and panel contacts at the mounting surface, wherein the plurality of package contacts of each package in the stacked microelectronic assembly are electrically coupled via an electrically conductive material with a corresponding set of panel contacts at the mounting surface. Planes defined by the major surfaces of the dielectric elements can be oriented at a substantial angle relative to the mounting surface.

In accordance with one embodiment, a stacked microelectronic assembly can comprise a plurality of stacked microelectronic packages. Each microelectronic package can include a dielectric element having a major surface defining a plane, an interconnect edge surface extending away from the major surface and an interconnect region adjacent the interconnect edge surface. A plurality of electrically conductive package contacts can be disposed at the interconnect region. Each package may include a plurality of stacked microelectronic elements each microelectronic element having a front surface defining a plane extending in a first direction and a second direction transverse to the first direction, a plurality of edge surfaces extending away from the plane of the front surface, each microelectronic element having a plurality of chip contacts at the front surface, the microelectronic elements stacked with the planes parallel to one another, The plurality of microelectronic packages can be stacked with one another such that planes defined by the major surfaces of the dielectric elements are substantially parallel to one another. A circuit panel has a mounting surface and panel contacts at the mounting surface, wherein the plurality of package contacts of each package in the stacked microelectronic assembly are electrically coupled via an electrically conductive material with a corresponding set of panel contacts at the mounting surface. Planes defined by the major surfaces of the dielectric elements can be oriented at a substantial angle relative to the mounting surface.

A method is disclosed for fabricating a stacked microelectronic assembly. A plurality of microelectronic packages are fabricated. Each package comprises a dielectric element having a major surface defining a plane, an interconnect edge extending away from the major surface and an interconnect region adjacent the interconnect edge with a plurality of electrically conductive package contacts at the interconnect region. One or more microelectronic elements each having a memory storage array thereon, and having a front surface defining a plane extending in a first direction and a second direction transverse to the first direction and having edge surfaces extending away from the plane of the front surface, each microelectronic element having a plurality of chip contacts at the front surface, the plane defined by each microelectronic element parallel to the plane defined by the major surface of the dielectric element of the respective microelectronic package.

The plurality of microelectronic packages are received into respective receiving volumes or slots of a heat spreader element, and the package contacts of each microelectronic package are bonded to corresponding panel contacts at a major surface of a circuit panel, wherein the planes defined by the dielectric elements are oriented at a substantial angle relative to the major surface of the circuit panel.

As used in this disclosure with reference to a dielectric region or a dielectric structure of a component, e.g., circuit structure, interposer, microelectronic element, capacitor, voltage regulator, circuit panel, substrate, etc., a statement that an electrically conductive element is "at" a surface of the dielectric region or component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

FIG. 1 illustrates a microelectronic assembly 100 in accordance with an embodiment of the invention. As seen in FIG. 1, microelectronic assembly 100 includes a package stack 110 which includes a plurality of microelectronic packages 108, each microelectronic package including one or more microelectronic elements 112. Microelectronic assembly 100 and other microelectronic assemblies disclosed or referenced herein can provide enhanced storage density which can be advantageously provided in various computing systems which can be small, medium, or large-scale computing systems, or which may be advantageously used in data centers, among which are enterprise systems, government systems, hosted systems, search engine systems, cloud storage, or other large-scale data centers.

Each package may include a single microelectronic element 112, or in the particular case seen in FIGS. 1-2, a plurality of stacked microelectronic elements. In one example, microelectronic element 112 may be a bare semiconductor chip, or may be a semiconductor chip having contacts at a front face thereof and additional electrically conductive features thereon which overlie the front face and are coupled with the contacts. Each microelectronic element 112, e.g., a semiconductor chip has a front surface 114 defining a respective plane 116-$x$ of a plurality of planes 116-1, 116-2, etc. Each microelectronic element 112 may have a plurality of contacts 118 at a front surface thereof at or near a peripheral edge surface 120 of the chip, with a rear surface 122 opposite the front surface, and the interconnect edge surface 120 extending between the front and rear surfaces. Commonly available flash memory semiconductor chips, such as the NAND and NOR type flash memory chips mentioned below, typically have their chip contacts disposed at the front surface near a single peripheral edge surface 120 of the semiconductor chip. Although the front surfaces of each of the chips in the package stack are shown all oriented in the same direction in FIGS. 1 and 2, the front surfaces of one or more of the chips in the package stack can be oriented in the opposite direction such that portions of the front surfaces of at least two of the chips which are adjacent one another would either face one another or would face in opposite directions away from one another. As seen in FIG. 2, a second peripheral edge surface 121 of each chip is opposite from the peripheral edge surface 120.

As best seen in FIG. 2, each stack of microelectronic elements 112 may include a dielectric region 115 that extends between the rear surface 122-1 of a first chip 112-1 and a front surface 114-2 of a second chip 112-2 adjacent to the first chip in a microelectronic package. Such dielectric regions are disposed between adjacent surfaces of other chips in the package stack depicted in FIG. 2. The dielectric region may include one or more adhesive layers or other dielectric material. Typically, the dielectric region includes at least adhesive layers coupled to each of the opposed front or rear surfaces of adjacent chips in the package stack. In one embodiment, the dielectric region 115 includes one or more layers of epoxy, elastomer, polyimide, parylene, or other polymeric material.

In one example, each of the microelectronic elements includes one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C), compact flash or CF card and the like. Flash memory chips typically have NAND or NOR type devices therein; NAND type devices are common. Other examples of microelectronic elements 112 include one or more of DRAM, microprocessor or controller chips or combinations thereof. Each semiconductor chip may be implemented in one of various semiconductor materials such as silicon, germanium, gallium arsenide or one or more other Group III-V semiconductor compounds or Group II-VI semiconductor compounds, etc. The microelectronic elements 112 in one or more microelectronic packages 108 and in one or more "package stacks" 110 may be a combination of different chip functionalities as described above and may comprise a combination of various different semiconductor materials as described above. In one embodiment, a microelectronic element may have a greater number of active devices for providing memory storage array function than for any other function.

Each package 108 of the package stack 110 also includes a dielectric element 130 having a major surface 132 which defines a plane 134. The dielectric element 130 may have one or multiple layers of dielectric material and one or multiple electrically conductive layers thereon. The dielectric element 130 can be formed of various materials, which may or may not include a polymeric component, and may or may not include an inorganic component. Alternatively, the substrate may be wholly or essentially polymeric or may be wholly or essentially inorganic. In various non-limiting examples, the dielectric element can be formed of a composite material such as glass-reinforced epoxy, e.g., FR-4, or glass or ceramic material.

A plurality of electrically conductive package contacts 124, 126 are disposed at an interconnect region 136 of the dielectric element 130 adjacent an interconnect edge 138 of the dielectric element 130. In one example seen in FIGS. 1 and 2, package contacts 124 are at a first major surface 132 of the dielectric element 130, and package contacts 126 are at a second major surface 135 of the dielectric element opposite from the first major surface 132. A thermally conductive plane, e.g., 131A, 131B, may be disposed at one or both of the first or second major surfaces 132, 135.

Element contacts 118 at front surfaces 114 of each microelectronic element of the package 108 are electrically coupled with the package contacts 124, 126 such as through leads 128 which may include, for example, wire bonds coupled to the microelectronic elements 112 arranged in an offset or staggered arrangement such as seen in FIG. 2. Alternatively, the electrical connections between the package contacts 124, 126 and the element contacts 118 can include a curable electrically conductive material, such as, for example, an electrically conductive material in a polymer matrix or electrically conductive ink deposited as drops, droplets or lines of the conductive material onto the package contacts, element contacts, and the areas in between. Alternatively, lines of conductive material can be formed by blanket depositing such material and then removing the material between laterally adjacent contacts on the same microelectronic subassembly or package 108, and between adjacent portions of the leadframe on the same microelectronic package 108. In one example, the electrically conductive material can be such as described in U.S. Pat. No. 8,178,978 to McElrea et al., the disclosure of which is incorporated herein by reference. Alternatively, electrical connections between the package contacts and the element contacts can include a metal plated onto and in-between the package contacts 124, 126 and the element contacts 118.

Each package contact 124, 126 may extend to the interconnect edge 138 of the package 108 in an interconnect region 136 which may extend from a peripheral edge or "remote surface" of the respective package 108. In some cases, a dielectric region or insulating encapsulant region 140 may contact the element contacts 118 at the front surface of each microelectronic element 112 and may overlie a portion the major surface 132 of the dielectric element 130. In one example, as seen in FIGS. 1 and 2, the encapsulant region 140 has a major surface 142 which is substantially parallel to the major surface 132 of the dielectric element. In particular cases, the encapsulant region of a given package can extend laterally outward beyond two or more edge surfaces of the microelectronic elements 112 in the package to corresponding remote surfaces of the package which are spaced apart from the edge surfaces of the microelectronic elements. In an example, the dielectric region 140 may be or may include a molded dielectric region. In one example, the dielectric region may comprise a polymeric dielectric material, or alternatively a polymeric dielectric material with a filler therein which may have a lower coefficient of thermal expansion than the polymeric material. In some examples, the filler may include particles, flakes or a mesh or scaffold of an inorganic material such as a glass, quartz, ceramic or semiconductor material, among others.

As mentioned above, all package interconnects of a package typically are available for connection at an interconnect region adjacent the same interconnect edge 138 of the package. As further seen in FIG. 1, the package contacts 124, 126 of a stacked microelectronic package 108 in the package stack, in turn, are electrically coupled to respective panel contacts 162 at a major surface 164 of a circuit panel 160 through an electrically conductive material 127. It will be appreciated that the substantially parallel planes 134, 116 defined by the major surface and front surfaces of the dielectric elements and microelectronic elements are oriented at a non-zero angle 168 to a plane 165 defined by the major surface 164 of the circuit panel. In one example, the angle 168 may be a greater than or equal to 10 degrees. In a particular example, the angle can be a substantial angle having a measure greater than or equal to 20 degrees. In another example, the angle 168 can be greater than or equal to 30 degrees. In another example, the angle 168 can be greater than or equal to 15 degrees. In yet another example, the angle 168 can be greater than or equal to 90 degrees, or in some cases, can be greater than or equal to 120 degrees. FIG. 1 shows an example in which the angle 168 has a measure equal or substantially equal to 90 degrees. In this case, the major surface 164 of the circuit panel faces edge surfaces 120 of each microelectronic element. An insulating layer 170, which in some cases may be a mechanically reinforcing layer such as an underfill, may be applied surrounding the electrical connections between the package contacts 124, 126 and the panel contacts 162. In some cases, the insulating layer 170 can mechanically reinforce or stiffen such electrical connections and may help those electrical connections withstand stresses due to differential thermal expansion between the packages 108 and the circuit panel 130. In one example, the insulating layer can be a "board level underfill layer."

In particular examples, the electrically conductive material 127 may be conductive masses, conductive pillars, stud bumps or other suitable electrically conductive material may be used to electrically connect each of the package contacts 124, 126 with a corresponding panel contact 162. Here, the conductive material 127 can be in form of electrically conductive bumps such as masses of solder, tin, indium or eutectic material, or drops or droplets of electrically conductive polymer material or electrically conductive ink on surfaces of the panel contacts 162 and contacting the corresponding package contacts 124, 126. In one example, the electrically conductive material 127 may be applied to the panel contacts 162, the package contacts 124, 126, or both the package contacts and the panel contacts through a transfer mold of solder bumps, balls or features, or application of solder balls, for example, or may alternatively be deposited on the substrate contacts by plating or depositing a metal or other conductive material. Alternatively, the electrically conductive material 127 can be applied by depositing one of the above-mentioned electrically conductive polymer or electrically conductive ink or other such material as disclosed in the incorporated U.S. Pat. No. 8,178,978.

In one example, the circuit panel can be a motherboard. In another example, the circuit panel 160 can be a daughter board, module board or other board or circuit panel configured for electrical connection within a system which includes the microelectronic package stack 110 and circuit panel. The panel contacts 162 can be configured for surface mounting to another component which can be a card, tray, motherboard, etc., such as via a land grid array (LGA), ball grid array (BGA), or other technique. As in the case of the dielectric element 130, the circuit panel 160 may include a dielectric element or other substrate which may have one or multiple layers of dielectric material and one or multiple electrically conductive layers thereon. The circuit panel 160 can be formed of various materials, which may or may not include a polymeric component, and may or may not include an inorganic component. Alternatively, the circuit panel may be wholly or essentially polymeric or may be wholly or essentially inorganic. In various non-limiting examples, the support element can be formed of a composite material such as glass-reinforced epoxy, e.g., FR-4, a semiconductor material, e.g., Si or GaAs, or glass or ceramic material.

Referring to FIG. 3 et seq., stages in a method of fabricating a microelectronic assembly 100 will now be described. As seen in FIG. 3, a package stack 110 comprises a plurality of microelectronic packages 108, each having features as described above relative to FIGS. 1 and 2. The microelectronic packages 108 in each package stack 110 can be thermally coupled between the major surface 142 of the encapsulant region 140 and the major surface 135 of a dielectric element 130 substantially parallel and adjacent thereto in the package stack. The thermally conductive adhesive or grease can act to spread heat among the microelectronic packages in the assembly, and may also help conduct heat from internal areas remote from exterior edges of the assembly to edges of each package 108 which lie a exterior surfaces (not shown) of the package stack 110. FIG. 3 further illustrates the circuit panel 160 having the electrically conductive material 127 on the panel contacts 162 at the major surface 164 of the circuit panel. FIG. 4 further illustrates a layout of the packages 108 within the package stack, wherein the dashed lines therein represent the upwardly facing major surfaces 132 of the dielectric elements 130 of the respective packages 108 in the package stack 110. FIG. 5 illustrates bumps of the electrically conductive material 127 at the major surface 164 of the circuit panel prior to assembly of the package stack 110 thereto.

FIG. 6 further shows the package stack 110 after the package contacts are coupled with the corresponding bumps of the electrically conductive material 127 at the major surface of the circuit panel.

Figure 7:
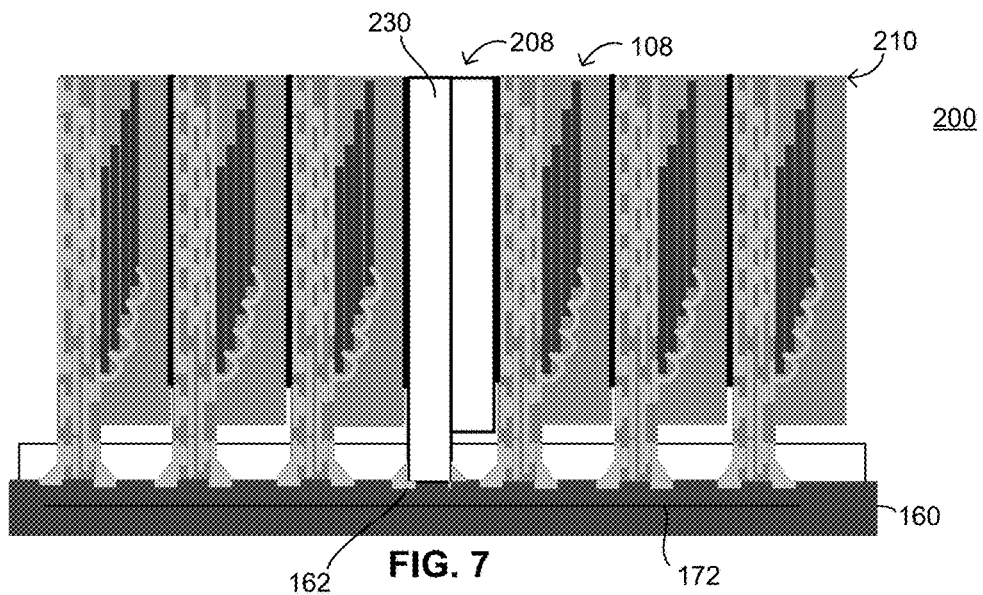
FIG. 7 is a sectional view depicting a microelectronic assembly in accordance with a variation of the embodiment disclosed relative to FIG. 1 herein.

FIG. 7 illustrates a microelectronic assembly 200 in accordance with an alternative configuration in which the package stack 210 includes microelectronic packages 108 and, in addition, a second package 208 which can be interconnected with the circuit panel in similar fashion as the microelectronic packages 108. In one example, the second package 208 comprises a second dielectric element 230 and a second microelectronic element electrically coupled thereto having active devices thereon which implements a registered clock driver. The registered clock driver can be configured to regenerate signals received from a common signaling bus 172, e.g., a command address bus, on the circuit panel 160 and to transmit such signals on to other packages 108 within the microelectronic assembly. For example, when individual packages 108 therein include microelectronic elements having memory storage arrays thereon, the second package 208 can be configured to receive one or more of clock, command and address signals from the circuit panel through the panel contacts 162 coupled thereto and then regenerate all or part of such signals. The microelectronic element of the second package 208 can regenerate signals and transmit the same to other packages 108 through others of the panel contacts 162 to which the second package 208 is coupled in the microelectronic assembly 200.

FIG. 8 illustrates another variation in which package stacks 300 and 310 each similar to the package stacks 110 or 210 described above are coupled to respective panel contacts 162, 262 at first and second oppositely-facing mounting surfaces 164, 264 being major surfaces of the circuit panel 160. At each mounting surface 164, the first panel contacts 162 are arranged threat in first and second transverse directions parallel to the mounting surface such that centers of adjacent ones of said first panel contacts are arranged at a minimum pitch or greater. Similarly, the second panel contacts 262 are arranged in first and second transverse directions parallel to the mounting surface such that centers of adjacent ones of said first panel contacts are arranged at a minimum pitch or greater. Referring to FIG. 9A, in a particular example, individual packages 108 of a first package stack 300 have columns 224, 226 of package contacts at respective opposite surfaces of the dielectric element 130 of each microelectronic package, wherein package contacts 124, 126 at the respective interconnect regions of each package are electrically coupled with the panel contacts 162, 262 of the circuit panel. FIG. 9A also illustrates an example of signal assignments of the package contacts in each column 224, 226 of package contacts 124, 126 of each package 108.

Conversely, individual packages 308 of a second package stack 310 mounted to the oppositely facing second mounting surface 264 have columns 234, 236 of package contacts 124, 126 at the respective interconnect regions of each package 308. FIG. 9B also illustrates an example of signal assignments of the package contacts in each column 234, 236 of package contacts 124, 126 of each package 308. As will be appreciated from a comparison of the column 226 of package contacts on the packages 108 with the corresponding column 236 on packages 308, the signal assignments of the column 224 of package contacts in packages 108 are mirrored relative to the signal assignments of the column 234 of package contacts in packages 308 of the package stack 310 opposite thereto. In addition, the signal assignments of the column 226 of package contacts in packages 108 are mirrored relative to the signal assignments of the column 236 of package contacts in packages 308 of the package stack 310 opposite thereto. Specifically, the signal assignments of individual package contacts in a column 224 on a package 108 of the first package stack 300 are symmetric about a theoretical axis 250 relative to the signal assignments of individual package contacts in column 234 on a package 308 of the second package stack 310, and the same relationship is true of the signal assignments in column 226 of a package

108 being mirrored relative to the signal assignments of package contacts in column 236 of a package 308.

Accordingly, in the mirrored configuration, panel contacts 162, 262 on the opposite surfaces of the circuit panel which are assigned to carry a given signal may be aligned within one minimum pitch of the panel contacts 162 with one another in first and second transverse directions which are parallel to the mounting surface 164. As a result, the lengths of stubs which couple the microelectronic elements within the microelectronic packages 108, 308 on opposite surfaces of the circuit panel to the signaling bus 172 can be shortened, because package contacts in column 224 of package contacts of a first package 108 are coincident with the package contacts in a corresponding column 234 of package contacts of a second package 308 in the package stack 310 which have the corresponding or identical signal assignment and thus are electrically coupled to a same conductor of the signaling bus. Reducing the lengths of the stubs which electrically interconnect corresponding package contacts of the microelectronic packages 108, 308 coupled to an electrically conductive signaling path of a common signaling bus 172 (e.g., an address bus or command address bus) on the circuit panel 160 in this manner can mitigate adverse effects of loading due to the stubs on the quality of signals carried by the address bus or command address bus on the circuit panel. In such way, the total energy due to reflections in the stubs coupling the microelectronic elements in the package stacks 300, 310 to the signaling bus 172 can be reduced.

In one example, the signal assignments of each package contact of a column 224 of package contacts which are configured to carry address signals on a package 108 are mirrored relative to the signal assignments of a column 234 of package contacts which are configured to carry address signals on a package 308. In a further example, the signal assignments of each of the package contacts which are configured to carry a clock signal on a package 108 are mirrored relative to the signal assignments of each of the package contacts which are configured to carry a clock signal on a package 308.

FIG. 9C illustrates a microelectronic assembly according to a variation of the embodiment seen in FIG. 8. In this case, a package stack 410 has package contacts electrically coupled with the panel contacts 362 at second major surface 264 of the circuit panel at locations which are offset from locations at which the package contacts of a package stack 300 are electrically coupled with the panel contacts 162. The spatial offset between package stacks 300, 410 can help address electrical effects due to loading of stubs which electrically interconnect the microelectronic elements in each package with the signaling bus 172.

FIG. 10 depicts yet another embodiment in which microelectronic packages 508 have microelectronic elements which, in addition to overlying major surface 132 of the dielectric element 130, include microelectronic elements overlying the oppositely-facing major surface 135 of the dielectric element 130.

Figure 11:
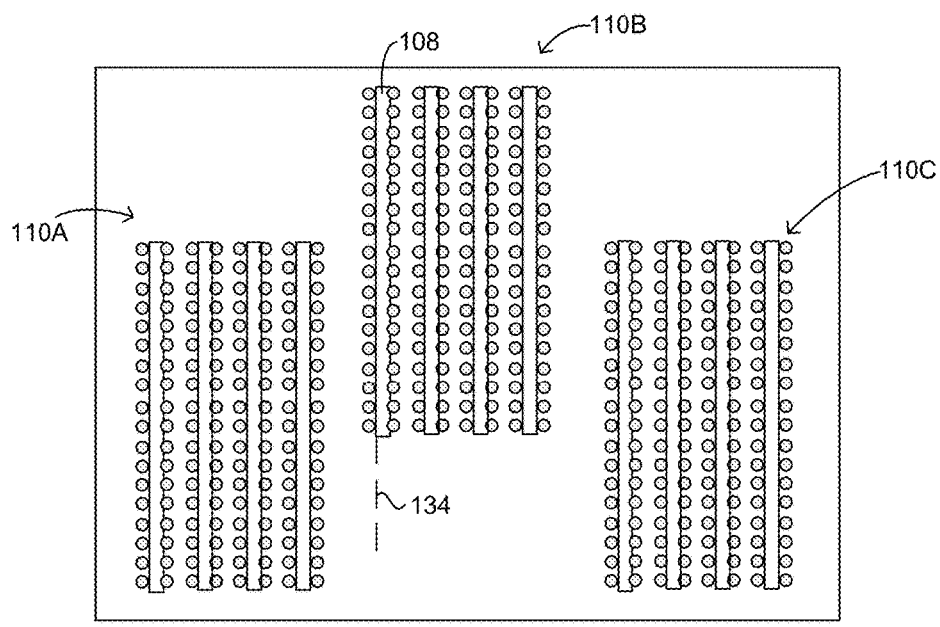
FIG. 11 is a top down view depicting a microelectronic assembly in accordance with a variation of the embodiment disclosed relative to FIG. 6 herein.

FIG. 11 illustrates microelectronic assemblies in accordance with embodiments of the invention in which an assembly of microelectronic packages 110A are staggered relative to another assembly of microelectronic packages 110B, such as in a direction parallel to a direction of the plane defined by the major surface of the dielectric element of each package 108 therein.

Figure 12:
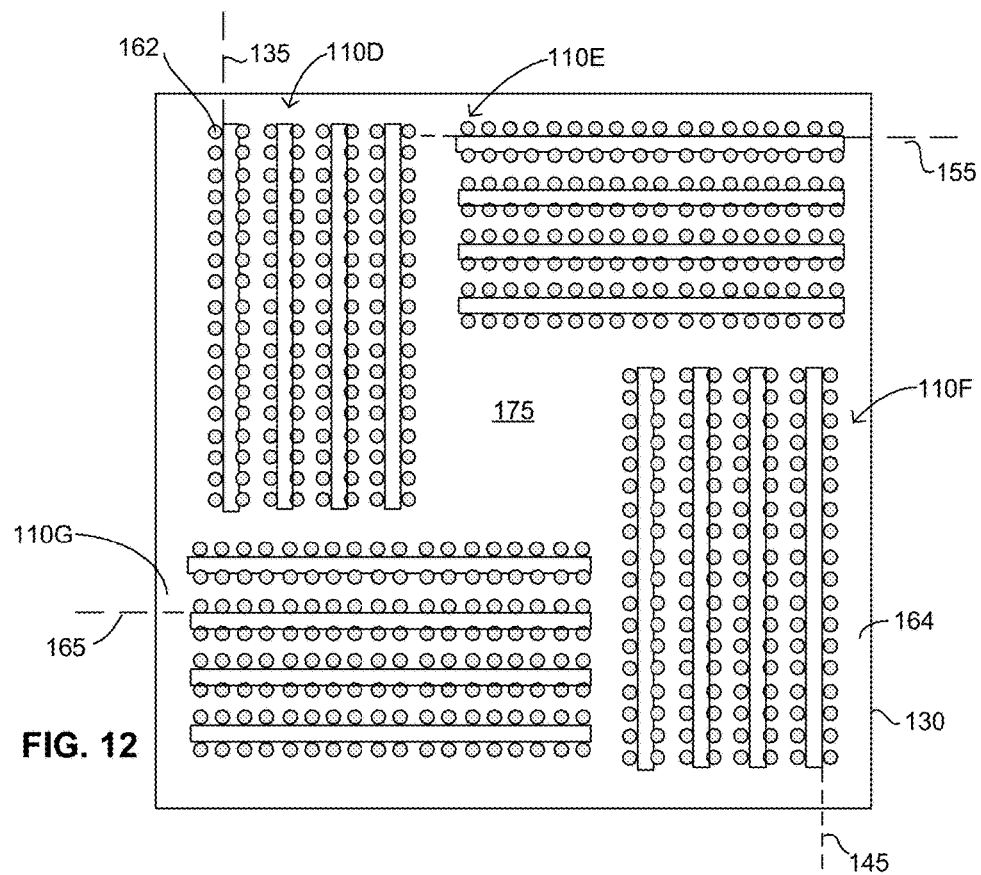
FIG. 12 is a top down view depicting a microelectronic assembly in accordance with a variation of the embodiment disclosed relative to FIG. 6 herein.
Figure 13:
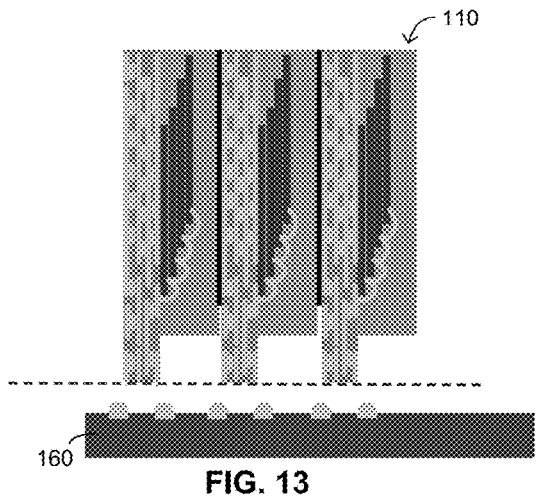
FIGS. 13, 14, 15 and 16 are sectional views depicting stages in fabrication of a microelectronic assembly in accordance with an embodiment of the invention.

FIG. 12 illustrates yet another embodiment in which a plurality of package stacks 110D, 110E, 110F and 110G which are arranged and mounted to corresponding panel contacts 162 at surface 164 of the circuit panel 130. In this case, the package stacks 110D, 110E, . . . , are arranged in a pattern having a form of a pinwheel or flower. The pinwheel pattern may allow space for an additional component to be mounted to the circuit panel in area 175 of the surface 164 between the package stacks. In this case, first planes 135 defined by the first major surfaces of the first set of stacked packages can be parallel to first planes 145 defined by the first major surfaces of the third set of stacked packages, second planes 155 defined by the first major surfaces of the second set of stacked packages are parallel to second planes 165 defined by the first major surfaces of the fourth set of stacked packages. In addition, as seen in FIG. 12, the first planes 135 intersect the second planes 155 and may also intersect the fourth planes 165.

Figure 14:
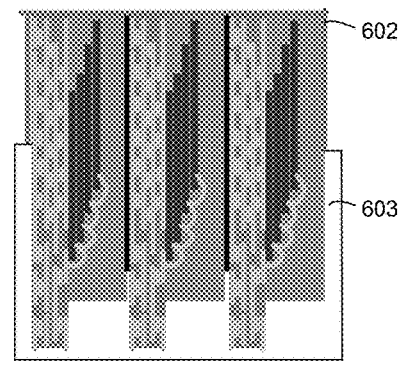
Figure 15:
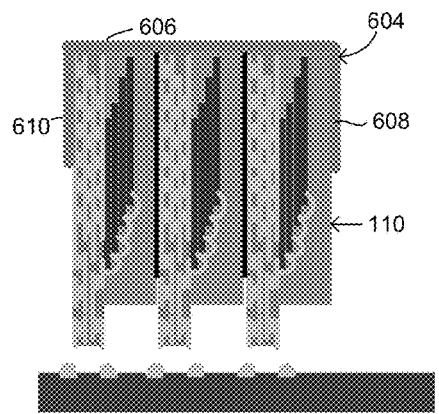
Figure 16:
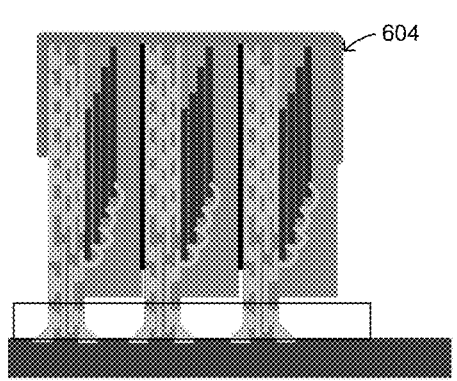
Figure 17:
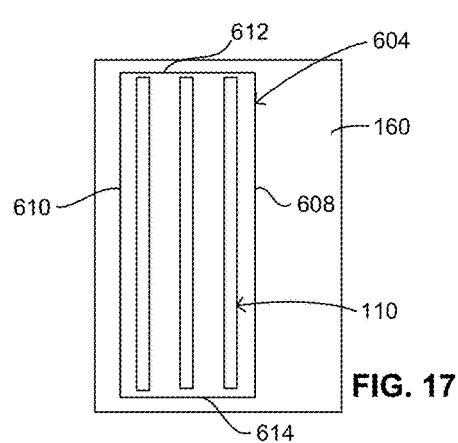
FIG. 17 is a top down view further depicting a microelectronic assembly corresponding to that depicted in FIG. 16.

FIGS. 13, 14, 15, 16, 17 illustrate stages in a method of assembling a microelectronic assembly in accordance with an embodiment of the invention which additionally includes a thermally conductive heat spreader 604 contacting external surfaces of the package stack 110. In one example, the heat spreader 604 can be made of a metal having high thermal conductivity, which may be copper, nickel or other suitable metal. In a particular fabrication example, the heat spreader can be formed by coating external surfaces of a portion of a package stack with an electrically conductive commoning layer or seed layer 602 as seen in FIG. 14. For example, the seed layer 602 can be deposited by physical or chemical vapor deposition or electroless plating, and in one example can be performed while covering other portions of the external surfaces with removable film 603, resist or other coating to avoid the seed layer from being deposited where not desired. The removable film, resist or other coating then is removed. Alternatively, the seed layer 602 can be deposited on all exposed surfaces and then portions of seed layer where the heat spreader 604 is to be formed are then covered with a removable film, resist or other removable coating, and then the seed layer 602 is removed from all areas that are not covered. The removable film, resist or other coating then is removed. As further seen in FIG. 15, the heat spreader 604 then is formed such as by an electroplating process which selectively deposits a highly thermally conductive metal such as copper on the seed layer 602 overlying the external surfaces of the package stack 110 include a surface 606 which faces upwardly and surfaces 608, 610 which face in opposite directions and extend away from the upwardly facing surface 606. As further seen in FIG. 16, the package stack having the heat spreader formed thereon now is assembled with the circuit panel in a manner such as described above relative to FIGS. 1-3. FIG. 17 further illustrates the heat spreader as seen from above the package stack 110, with the heat spreader overlying external surfaces 608, 610 of the package stack as seen in FIG. 15, and the heat spreader also overlying external surfaces 612, 614 of the package stack which extend between the external surfaces 608, 610.

In accordance with yet another variation, FIGS. 18, 19, 20, and 21 depict the assembly of microelectronic packages 108 with a heat spreader 704 (FIG. 19) having slots 706 sized to accommodate individual packages 108. In this case, the heat spreader includes a thermally conductive plane 708 disposed between a first microelectronic package 108 and a second microelectronic package 108 adjacent to the first microelectronic package in the stacked microelectronic assembly.

As seen in FIGS. 18-19, the packages 108 can be inserted into the slots 706 to form a subassembly 710 (FIG. 19) prior to electrically connecting the packages 108 with the circuit panel as depicted in FIGS. 20 and 21.

FIG. 22 depicts a microelectronic assembly according a variation of the embodiment shown in FIG. 18 in which the heat spreader 804 additionally includes fins 812 to further enhance heat dissipation from the assembly in operation of the assembly in an electronic system.

Although not specifically shown in the Figures or particularly described in the foregoing, elements in the various Figures and various described embodiments can be combined together in additional variations of the invention.

The invention claimed is:

1. A stacked microelectronic assembly, comprising:
a plurality of stacked microelectronic packages, each microelectronic package comprising:
a dielectric element having a first major surface defining a plane and a second major surface opposite the first major surface, an interconnect edge surface extending away from the first major surface and an interconnect region adjacent the interconnect edge surface;
a plurality of electrically conductive package contacts at the interconnect region;
a microelectronic element having a front surface overlying and substantially parallel to the major surface, and a plurality of chip contacts at the front surface electrically coupled with the package contacts; and
an encapsulation region having a surface substantially parallel to the first and second major surfaces of the dielectric element;
the plurality of microelectronic packages stacked with one another such that planes defined by the major surfaces of the dielectric elements are substantially parallel to one another, wherein the surface of the encapsulation region of a first microelectronic package of the plurality of microelectronic packages is mechanically coupled with the second major surface of a second microelectronic package of the plurality of microelectronic packages;
a circuit panel having a mounting surface and surface mount panel contacts at the mounting surface, wherein the plurality of package contacts of each package in the stacked microelectronic assembly are electrically coupled via electrically conductive bumps with a corresponding set of the panel contacts at the mounting surface via a ball grid array, wherein the planes defined by the major surfaces of the dielectric elements are oriented at a non-zero angle relative to the mounting surface; and
an underfill surrounding the electrically conductive bumps, the underfill mechanically reinforcing connections between the panel contacts and the plurality of package contacts of each package in the stacked microelectronic assembly.

2. The stacked microelectronic assembly as claimed in claim 1, wherein the microelectronic element comprises a plurality of memory microelectronic elements, each having a memory storage array thereon.

3. The stacked microelectronic assembly as claimed in claim 2, wherein, in each microelectronic package, the dielectric element has a first surface and a second surface facing away from the first surface, and the package contacts include first package contacts at the first surface and second contacts at the second surface.

4. The stacked microelectronic assembly as claimed in claim 3, wherein the first and second surfaces are first and second major surfaces of the dielectric element.

5. The stacked microelectronic assembly as claimed in claim 2, wherein a first package of the stacked microelectronic packages includes a plurality of the microelectronic elements stacked one atop another, and an encapsulation region of the first package is in contact with edge surfaces of each of the stacked microelectronic elements of the first package.

6. The stacked microelectronic assembly as claimed in claim 1, wherein each dielectric element has a first edge surface opposite from the interconnect edge surface, and second and third edge surfaces each extending in a direction between the first edge surface and the interconnect edge surface, the stacked microelectronic assembly further comprising a heat spreader overlying at least portions of one or more of the first, second and third edge surfaces of at least some of the plurality of microelectronic packages.

7. The stacked microelectronic assembly as claimed in claim 6, wherein the heat spreader overlies portions of each of the first, second and third edge surfaces of each of at least some of the plurality of microelectronic packages.

8. The stacked microelectronic assembly as claimed in claim 7, wherein the heat spreader includes a thermally conductive plane disposed between a first microelectronic package and a second microelectronic package adjacent to the first microelectronic package in the stacked microelectronic assembly.

9. The stacked microelectronic assembly as claimed in claim 2, wherein the mounting surface of the circuit panel is a first mounting surface, the panel contacts are first panel contacts, and the circuit panel has a second mounting surface opposite the first mounting surface, and second panel contacts at the second mounting surface, the stacked microelectronic packages including a first plurality of the stacked microelectronic packages at least partially overlying the first mounting surface of the circuit panel and having package contacts electrically coupled with the first panel contacts, and a second plurality of the stacked microelectronic packages at least partially overlying the second mounting surface of the circuit panel and having package contacts electrically coupled with the second panel contacts.

10. The stacked microelectronic assembly as claimed in claim 9, wherein the first panel contacts are arranged at the mounting surface such that centers of adjacent ones of said first panel contacts are arranged at a minimum pitch or greater, wherein each first panel contact configured to carry a given signal is aligned within the minimum pitch in the first and second directions with a corresponding second panel contact configured to carry the given signal.

11. The stacked microelectronic assembly as claimed in claim 10, wherein signal assignments of each of at least some package contacts on each package of the second plurality of stacked packages are mirrored relative to the signal assignments of each of at least some package contacts at positions of at least some package contacts on each package of the first plurality of stacked packages.

12. The stacked microelectronic assembly as claimed in claim 10, wherein the stacked microelectronic packages having memory storage arrays thereon are first stacked packages, the stacked microelectronic assembly further comprising a second microelectronic package stacked between adjacent packages of the first stacked packages, the second microelectronic package configured to regenerate and transmit at least a clock signal to the first stacked packages.

13. The stacked microelectronic assembly as claimed in claim 9, wherein positions of the first plurality of the stacked microelectronic packages are staggered on the circuit panel relative to positions of the second plurality of the stacked microelectronic packages on the circuit panel.

14. The stacked microelectronic assembly as claimed in claim 2, wherein the plurality of stacked packages includes first, second, third, and fourth sets of stacked packages, wherein first planes defined by the first major surfaces of the first set of stacked packages are parallel to first planes defined by the first major surfaces of the third set of stacked packages, second planes defined by the first major surfaces of the second set of stacked packages are parallel to second planes defined by the first major surfaces of the fourth set of stacked packages, and the first planes intersect the second planes.

15. A stacked microelectronic package assembly, comprising:
    a plurality of stacked microelectronic packages, each comprising:
        a dielectric element having a first major surface defining a plane and a second major surface opposite the first major surface, an interconnect edge surface extending away from the first major surface and an interconnect region adjacent the interconnect edge surface;
        a plurality of electrically conductive package contacts at the interconnect region;
        a plurality of stacked microelectronic elements each microelectronic element having a front surface defining a plane extending in a first direction and a second direction transverse to the first direction, a plurality of edge surfaces extending away from the plane of the front surface, each microelectronic element having a plurality of chip contacts at the front surface, the microelectronic elements stacked with the planes parallel to one another; and
        an encapsulation region having a surface substantially parallel to the first and second major surfaces of the dielectric element,
    wherein the surface of the encapsulation region of a first microelectronic package of the plurality of microelectronic packages is mechanically coupled with the second major surface of a second microelectronic package of the plurality of microelectronic packages, and
    wherein the package contacts at the interconnect regions of each of the dielectric elements of the stacked microelectronic packages are configured to be bonded via electrically conductive bumps surrounded by an underfill to corresponding surface mount panel contacts at a mounting surface of a circuit panel via a ball grid array, which mounting surface is oriented at a substantial angle relative to the interconnect regions of the dielectric elements, the underfill mechanically reinforcing connections between the panel contacts and the plurality of package contacts of each package in the stacked microelectronic package assembly.

16. The microelectronic package as claimed in claim 15, wherein the edge surfaces of the stacked microelectronic elements of each microelectronic package are staggered relative to one another.

17. The microelectronic package as claimed in claim 15, wherein the stacked packages comprise thermally conductive planes, wherein a rear surface of a microelectronic element of each package which is closest to the dielectric element of such package is thermally coupled to the thermally conductive plane of such package.

18. A method of fabricating a stacked microelectronic assembly, comprising:
    fabricating a plurality of microelectronic packages, each comprising:
        a dielectric element having a major surface defining a plane, an interconnect edge extending away from the major surface and an interconnect region adjacent the interconnect edge, a plurality of electrically conductive package contacts at the interconnect region; and
        one or more microelectronic elements, each microelectronic element having a memory storage array thereon, and having a front surface defining a plane extending in a first direction and a second direction transverse to the first direction, a plurality of edge surfaces extending away from the plane of the front surface, each microelectronic element having a plurality of chip contacts at the front surface, the plane defined by each microelectronic element parallel to the plane defined by the major surface of the dielectric element of the respective microelectronic package,
    receiving at least portions of each of the plurality of microelectronic packages into respective slots of a heat spreader element, each slot sized to receive a corresponding individual one of the plurality of microelectronic packages; and
    bonding the package contacts of each microelectronic package to corresponding panel contacts at a major surface of a circuit panel, wherein the planes defined by the dielectric elements are oriented at a substantial angle relative to the major surface of the circuit panel.

19. The method as claimed in claim 18, wherein at least one of:
    the heat spreader element comprises fins extending in a direction away from the stacked microelectronic packages;
    each microelectronic package has an encapsulation region has a first surface oriented towards the major surface of the circuit panel, and second, third and fourth edge surfaces facing away from the first surface, wherein the heat spreader overlies the second, third and fourth edge surfaces; or
    each of the packages comprises a thermally conductive plane thermally coupled to a rear surface of a microelectronic element of each package, wherein the heat spreader thermally contacts the thermally conductive plane of each package.

* * * * *